US012677547B2

(12) United States Patent
Liu

(10) Patent No.: US 12,677,547 B2
(45) Date of Patent: Jul. 7, 2026

(54) DISPLAY PANEL AND MANUFACTURING METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Chaofan Liu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 631 days.

(21) Appl. No.: 17/614,508

(22) PCT Filed: Oct. 22, 2021

(86) PCT No.: PCT/CN2021/125815
§ 371 (c)(1),
(2) Date: Nov. 26, 2021

(87) PCT Pub. No.: WO2023/050499
PCT Pub. Date: Apr. 6, 2023

(65) Prior Publication Data
US 2023/0097113 A1    Mar. 30, 2023

(30) Foreign Application Priority Data
Sep. 29, 2021    (CN) .......................... 202111152440.5

(51) Int. Cl.
H10K 59/131    (2023.01)
H10K 50/86    (2023.01)
(Continued)

(52) U.S. Cl.
CPC ......... *H10K 59/131* (2023.02); *H10K 50/865* (2023.02); *H10K 71/00* (2023.02); *H10K 59/1201* (2023.02)

(58) Field of Classification Search
CPC .. H10K 59/131; H10K 59/1201; H10K 71/00; H10K 71/70; H10K 59/126; H10K 50/865
(Continued)

(56) References Cited

U.S. PATENT DOCUMENTS 6,535,261 B1    3/2003 Anno et al.
2010/0163284 A1*    7/2010 Tanahara .......... G02F 1/133351
445/24
(Continued)

FOREIGN PATENT DOCUMENTS

CN    1573483 A    2/2005
CN    101252136 A    8/2008
(Continued)

OTHER PUBLICATIONS

Translation for WO-2010010750-A1, Yoshida, Masahiro, "Active Matrix Substrate, Display Device, Method for Inspecting the Active Matrix Substrate, and Method for Inspecting the Display Device" (Year: 2010).*
(Continued)

*Primary Examiner* — Jacob Y Choi
*Assistant Examiner* — Ashley Nicole Blackwell
(74) *Attorney, Agent, or Firm* — PV IP PC; Christopher S. Ruprecht; Wei Te Chung

(57) ABSTRACT
A display panel and a manufacturing method thereof are provided. The display panel includes a substrate, and a first lead wire, a first bonding pad, and a first cutting portion located in a bezel area of the substrate. The first bonding pad is arranged on a side of the first lead wire away from the
(Continued)

substrate. The first bonding pad is arranged corresponding to the first lead wire and connected with the first lead wire. The first cutting portion is arranged in a same layer as the first bonding pad, spaced apart from the first bonding pad, and formed of same material as the first bonding pad. The first cutting portion is located on a side of the first lead wire away from the display area and connected with the first lead wire.

20 Claims, 13 Drawing Sheets

(51) Int. Cl.
*H10K 71/00* (2023.01)
*H10K 59/12* (2023.01)

(58) Field of Classification Search
USPC .......................................................... 257/40
See application file for complete search history.

(56) References Cited

U.S. PATENT DOCUMENTS

| | | | | |
|---|---|---|---|---|
| 2013/0128205 A1* | 5/2013 | Chien | .................... | G02F 1/1341 349/138 |
| 2016/0104757 A1* | 4/2016 | Kim | ..................... | H10K 59/131 438/34 |
| 2017/0092711 A1* | 3/2017 | Tsai | ..................... | H10K 59/131 |
| 2020/0295114 A1 | 9/2020 | Moon et al. | | |
| 2020/0303488 A1* | 9/2020 | Lee | ...................... | H10K 59/121 |
| 2021/0026182 A1* | 1/2021 | Yu | ........................ | G02F 1/13458 |
| 2021/0335988 A1* | 10/2021 | Um | ........................ | G06F 3/0202 |
| 2021/0364662 A1* | 11/2021 | Hua | .................... | G01T 1/20184 |
| 2021/0375702 A1* | 12/2021 | Xiao | ..................... | H10K 59/131 |

FOREIGN PATENT DOCUMENTS

| | | | | | |
|---|---|---|---|---|---|
| CN | 101359669 A | 2/2009 | | | |
| CN | 103698952 A | 4/2014 | | | |
| CN | 105139787 A | 12/2015 | | | |
| CN | 107065363 A | 8/2017 | | | |
| CN | 111736380 A | 10/2020 | | | |
| CN | 111868809 A | 10/2020 | | | |
| CN | 111900174 A | 11/2020 | | | |
| CN | 113078203 A | 7/2021 | | | |
| CN | 113163595 A | 7/2021 | | | |
| JP | H086069 A | 1/1996 | | | |
| WO | WO-2010010750 A1 * | 1/2010 | ........... | G09G 3/3611 |

OTHER PUBLICATIONS

Chinese Office Action issued in corresponding Chinese Patent Application No. 202111152440.5 dated Oct. 26, 2022, pp. 1-8.

International Search Report in International application No. PCT/CN2021/125815, mailed on Jun. 28, 2022.

Written Opinion of the International Search Authority in International application No. PCT/CN2021/125815,mailed on Jun. 28, 2022.

* cited by examiner

O

FL

A

20

30

A

40

O1

O1

PLN

VIA2

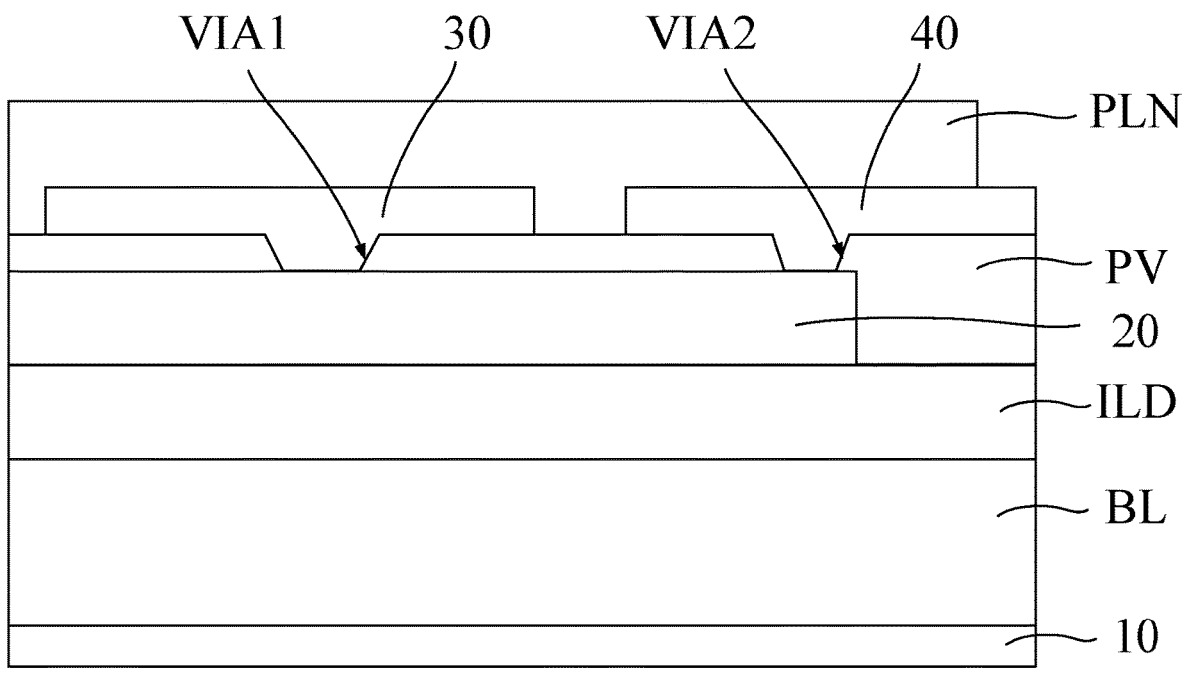
FIG. 4 （a）
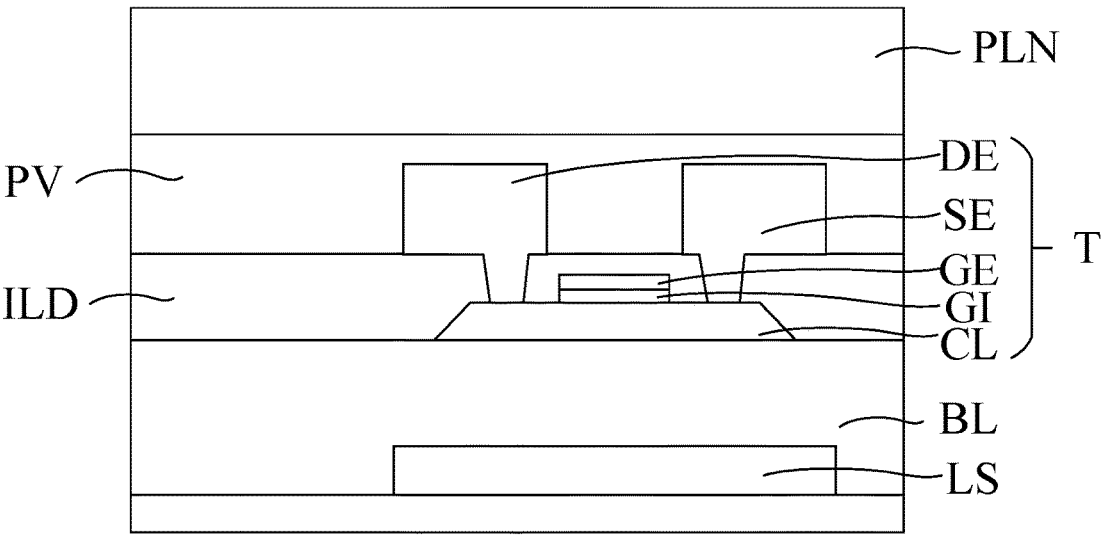
FIG. 4 （b）

VIA2 providing an intermediate substrate, wherein the intermediate substrate includes a display area, a bezel area and a to-be-cut area, the bezel area are arranged between the display area and the to-be-cut area, and the intermediate substrate includes: a substrate; a first lead wire disposed on the substrate and located in the bezel area; a first bonding pad disposed on a side of the first lead wire away from the substrate, wherein the first bonding pad is disposed corresponding to the first lead wire and connected with the first lead wire; a first to-be-cut lead wire arranged in a same layer as the first lead wire, spaced apart from the first lead wire, formed of same material as the first lead wire, and located in the to-be-cut area; and a first lead wire connection portion arranged in a same layer as the first bonding pad, spaced apart from the first bonding pad, formed of same material as the first bonding pad, and connected between the first lead wire and the first to-be-cut lead wire

101 cutting the intermediate substrate at the first lead wire connection portion, and removing the intermediate substrate in the to-be-cut area, thereby obtaining the display panel

DISPLAY PANEL AND MANUFACTURING METHOD THEREOF

FIELD OF INVENTION

This application relates to the fields of display technologies, and in particular to a display panel and a manufacturing method thereof.

BACKGROUND OF INVENTION

Organic light emitting diode (OLED) display products undergo reliability tests (RA) before leaving factories. The reliability tests are performed under screen test conditions at 60° C., 60% relative humidity for 240 hours to evaluate the presence of defects based on the screen test results. A known condition in the OLED display products in the reliability test is presence of a large number of vertical bright and dark line defects in a short period of time. The inventor conducted a defect analysis on this phenomenon. The analysis results have shown that the reason for the bright and dark line defects is that: during the reliability test, the OLED display panel is under a high-temperature and high-humidity environment, and ends of lead wires in a terminal area are electrochemically corroded in a section of a cutting line, so that signal lines are short-circuited to each other, resulting in the bright and dark line defects.

Technical Problem

In view of above, the present disclosure provides a display panel and a manufacturing method thereof, which can reduce the electrochemical corrosion of the cutting ends of the lead wires.

SUMMARY OF INVENTION

The present disclosure provides a display panel including a display area and a bezel area arranged adjacent to the display area, wherein the display panel includes:
    a substrate;
    a first lead wire disposed on the substrate and located in the bezel area;
    a first bonding pad disposed on a side of the first lead wire away from the substrate, wherein the first bonding pad is disposed corresponding to the first lead wire and connected with the first lead wire; and
    a first cutting portion arranged in a same layer as the first bonding pad, spaced apart from the first bonding pad and formed of same material as the first bonding pad, wherein the first cutting portion is located on a side of the first lead wire away from the display area and connected with the first lead wire.

In some embodiments, the display panel further including a second lead wire and a second cutting portion, wherein the second lead wire is arranged in a same layer as the first lead wire, the second lead wires is spaced apart from the first lead wires, the second cutting portion is located on a side of the second lead wire away from the display area and connected with the second lead wire, and the second cutting portion and the first cutting portion are located in different layers.

In some embodiments, the second cutting portion includes an end of the second lead wire away from the display area; or
    the second cutting portion is located between the substrate and the second lead wire.

In some embodiments, the display panel including a plurality of the first lead wires and a plurality of the second lead wires, and the plurality of first lead wires and the plurality of second lead wires are arranged alternately at intervals.

In some embodiments, the display panel including a thin film transistor, wherein the thin film transistor includes a source and a drain, and the source and the drain are arranged in a same layer as the first lead wire.

In some embodiments, the display panel including a thin film transistor, wherein the thin film transistor includes a source, a drain and an active layer, the source and the drain are arranged in the same layer as the first lead wire, the active layer is arranged between the source and the substrate, the display panel further includes a light shielding layer, the light shielding layer is arranged between the active layer and the substrate, and the second cutting portion is arranged in a same layer as the light shielding layer.

In some embodiments, a corrosion resistance of the first cutting portion is greater than a corrosion resistance of the first lead wire.

In some embodiments, material of the first lead wire is copper or aluminum, and material of the first cutting portion is at least one of molybdenum, titanium, nickel and chromium.

In some embodiments, a thickness of the first cutting portion is less than a thickness of the first lead wire.

In some embodiments, the display panel further including a planarization layer arranged on a side of the bonding pad away from the first lead wire, wherein the planarization layer covers a part of the first cutting portion connected with the first lead wire and exposes a part of the first cutting portion away from the first lead wire.

in some embodiments, the display panel including a data line and a fanout line, wherein the data line is located in the display area, the fanout line is located in the bezel area, and the fanout line is connected between the data line and the first lead wire.

The present disclosure further provides a manufacturing method of a display panel, including steps of:
    providing an intermediate substrate, wherein the intermediate substrate includes a display area, a bezel area and a to-be-cut area, the bezel area are arranged between the display area and the to-be-cut area, and the intermediate substrate includes:
    a substrate;
    a first lead wire disposed on the substrate and located in the bezel area;
    a first bonding pad disposed on a side of the first lead wire away from the substrate, wherein the first bonding pad is disposed corresponding to the first lead wire and connected with the first lead wire;
    a first to-be-cut lead wire arranged in a same layer as the first lead wire, spaced apart from the first lead wire, formed of same material as the first lead wire, and located in the to-be-cut area; and
    a first lead wire connection portion arranged in a same layer as the first bonding pad, spaced apart from the first bonding pad, formed of same material as the first bonding pad, and connected between the first lead wire and the first to-be-cut lead wire;
    cutting the intermediate substrate at the first lead wire connection portion, and removing the intermediate substrate in the to-be-cut area, thereby obtaining the display panel.

In some embodiments, the intermediate substrate further includes a second lead wire, a second to-be-cut lead wire and a second lead wire connection portion, wherein the second lead wire is arranged in the same layer as the first lead wire, the second lead wire is spaced apart from the first lead wire, the second to-be-cut lead wire is located in the to-be-cut area, the second to-be-cut lead wire is spaced apart from the second lead wire, the second lead wire connection portion is located on a side of the second lead wire away from the display area and connected with the second lead wire, and the second lead wire connection portion and the first lead wire connection portion are located in different layers, and the manufacturing method of the display panel further includes cutting the intermediate substrate at the second lead wire connection portion, and removing the intermediate substrate in the to-be-cut area, thereby obtaining the display panel.

In some embodiments, the second lead wire connection portion includes an end of the second lead wire away from the display area; or the second lead wire connection portion is located between the substrate and the second lead wire.

In some embodiments, the intermediate substrate includes a plurality of the first lead wires and a plurality of the second lead wires, and the plurality of first lead wires and the plurality of second lead wires are arranged alternately at intervals.

In some embodiments, the intermediate substrate including a thin film transistor, wherein the thin film transistor includes a source and a drain, and the source and the drain are arranged in a same layer as the first lead wire.

In some embodiments, the intermediate substrate includes a thin film transistor, the thin film transistor including a source, a drain and an active layer, the source and the drain arranged in the same layer as the first lead wire, the active layer arranged between the source and the substrate, the intermediate substrate further includes a light shielding layer, the light shielding layer arranged between the active layer and the substrate, and the second lead wire connection portion arranged in a same layer as the light shielding layer.

In some embodiments, a corrosion resistance of the first lead wire connection portion is greater than a corrosion resistance of the first lead wire.

Beneficial Effect

In the present disclosure, a first cutting portion is formed by using the metal layer forming the first bonding pad, a corrosion resistance of the material of the first bonding pad is greater than a corrosion resistance of the material forming the first lead wire, and a thickness of the material of the first bonding pad is less than a thickness of the first lead wire, which can reduce the electrochemical corrosion of the exposed first cutting portion without adding a new process.

DRAWINGS

FIG. 4(*a*) is a schematic cross-sectional view of FIG. 3 along line A-A; FIG. 4 (*b*) is a schematic cross-sectional view of a thin film transistor in the display area of FIG.

FIG. 9 is a flowchart of a manufacturing method of the display panel provided by the present disclosure.

DETAILED DESCRIPTION OF EMBODIMENTS

The technical scheme in the application will be clearly and completely described below in combination with the accompanying drawings in the embodiments of the application. It is apparent that the described embodiments are only parts of the embodiments of the present disclosure, not all of the embodiments. Based on the embodiments in the application, all other embodiments obtained by those skilled in the art without any creative work belong to the protection scope of the application.

In the present disclosure, unless otherwise clearly specified and limited, a first feature being "above" or "below" a second feature may include the first and second features directly, or not directly connected, but contacted through other features between them. Moreover, a first feature being "on", "over" and "above" a second feature includes that the first feature is directly above and obliquely above the second feature, or only indicates that a horizontal height of the first feature is higher than a horizontal height of the second feature. A first feature being "under", "below" and "beneath" a second feature includes that the first feature is directly under and obliquely under the second feature, or only indicates that a horizontal height of the first feature is less than a horizontal height of the second feature. In addition, the terms "first" and "second" are only used for descriptive purposes and cannot be understood as indicating or implying relative importance or implicitly indicating the number of indicated technical features. Thus, features defining "first" and "second" may explicitly or implicitly include one or more features.

The present disclosure provides a display panel. The display panel in the embodiments of the present disclosure may be used for mobile phones, tablet computers, e-readers, electronic display screens, laptops, smart phones, augmented reality (AR) devices, virtual reality (VR) devices, media players, wearable devices, digital cameras, vehicle navigators, etc.

The display panel in the embodiments of the present disclosure may be organic light emitting diode (OLED) display panels, quantum dot light emitting diode (QLED) display panels, micro light-emitting diode (micro LED) display panels, and mini light-emitting diode (Mini LED)

display panels or liquid crystal display panels, etc. Herein-after, OLED display panels are used as examples.

Figure 1:
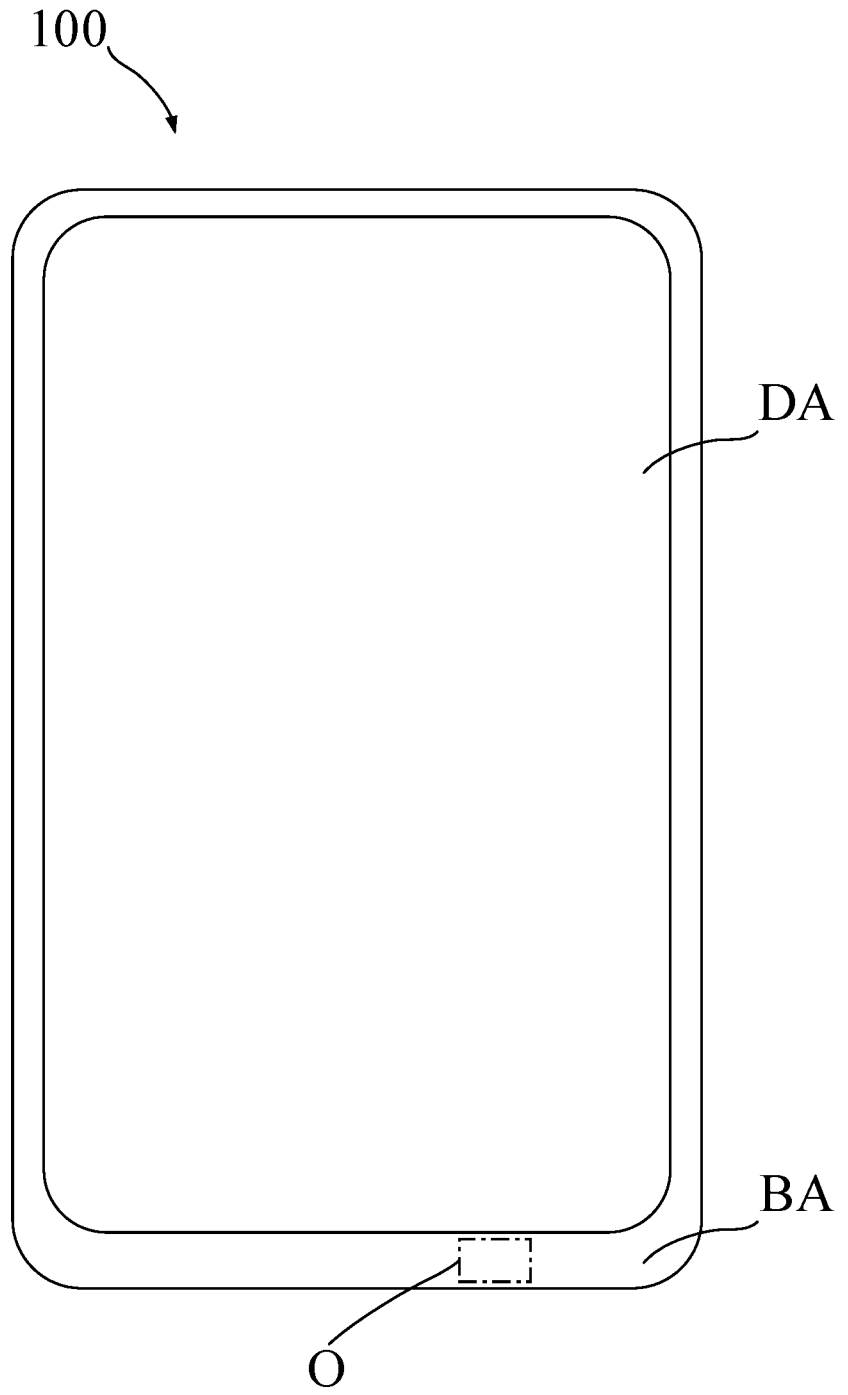
FIG. 1 is a schematic top view of a first embodiment of a display panel of the present disclosure.

As shown in FIG. 1, a first embodiment of a display panel 100 of the present disclosure includes a display area DA and a bezel area BA. The display area DA is provided with a pixel driving circuit, OLED light emitting components, a thin film encapsulation layer and other structures. The bezel area BA is configured adjacent to the display area DA. The bezel area BA is provided with lead wires, etc., and the bezel area BA is bonded with a driver chip. Optionally, the bezel area BA can be configured around the display area DA. The bezel area BA may include an upper bezel area, a lower bezel area, a left bezel area or a right bezel area. Hereinafter, a structure of the lower bezel area is described as an example. It should be noted that FIG. 1 shows a non-flexible display panel 100. In other embodiments of the present disclosure, the display panel 100 may also be a flexible display panel. When the display panel 100 is the flexible display panel, FIG. 1 shows an expanded view of the flexible display panel 100, and the lower bezel of the flexible display panel 100 can be bent to a back side of the display panel 100.

Figure 2:
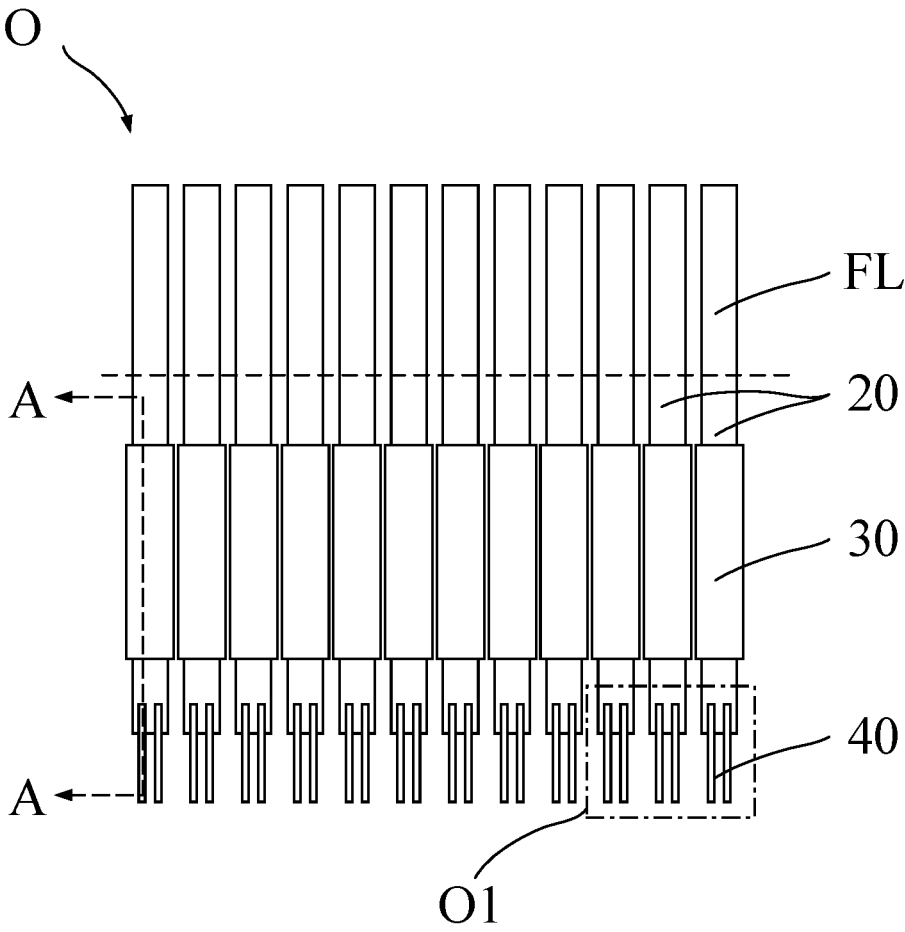
FIG. 2 is an enlarged schematic view of a portion O of the display panel of FIG. 1.
Figure 3:
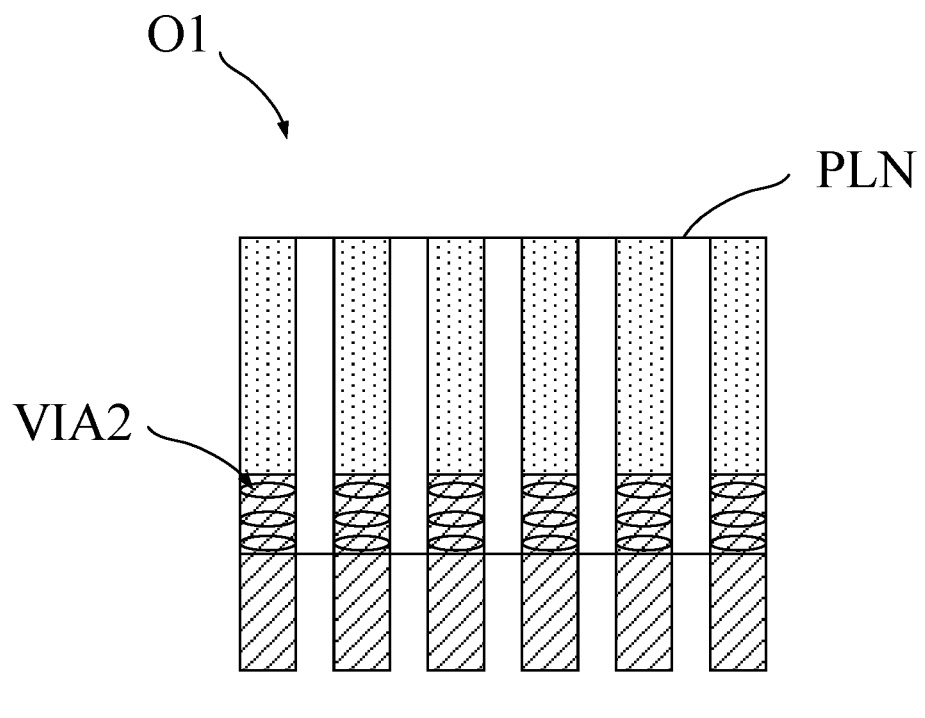
FIG. 3 is an enlarged schematic view of a portion O1 of FIG. 2.

Referring to FIGS. 2, 3, and 4(*a*) to 4(*b*), the display panel 100 includes a substrate 10, a first lead wire 20, a first bonding pad 30, and a first cutting portion 40. The first lead wire 20, the first bonding pad 30 and the first cutting portion 40 are located in the bezel area BA. The first lead wire 20 is disposed on the substrate 10. The first bonding pad 30 is arranged on a side of the first lead wire 20 away from the substrate 10. The first bonding pad 30 is arranged corresponding to the first lead wire 20 and connected with the first lead wire 20. The first cutting portion 40 is arranged in a same layer as the first bonding pad 30, the first cutting portion 40 is spaced apart from the and first bonding pad 30 and formed of same material as the and first bonding pad 30. Namely, the first cutting portion 40 and the first bonding pad 30 can be manufactured under a same mask with the same material. Moreover, the first cutting portion 40 is located on a side of the first lead wire 20 away from the display area DA and is connected with the first lead wire 20. In addition, the display panel 100 may also include a buffer layer BL and an interlayer insulating layer ILD located between the substrate 10 and the first lead wire 20, a passivation layer PV located between the first lead wire 20 and the first cutting portion 40, and a planarization layer PLN located on the first cutting portion 40.

Specifically, the substrate 10 may be a glass, plastic or flexible substrate. Material of the flexible substrate can be selected from one of polyimide (PI), polyethylene naphthalate (PEN), polyethylene terephthalate (PET), polyarylate (PAR), polycarbonate (PC), polyetherimide (PEI) and polyethersulfone (PES).

Referring to FIG. 4(*b*), the buffer layer BL is disposed on the substrate 10. A pixel driving circuit (not shown) is provided in the display area DA. The pixel driving circuit includes thin film transistors T and a light shielding layer LS. The light shielding layer LS is disposed on the substrate 10. Material of the light shielding layer LS may be a metal or a metal oxide, such as molybdenum (Mo), titanium (Ti), molybdenum oxide, etc. The buffer layer BL covers the light shielding layer LS. Material of the buffer layer BL may be selected from silica, nitrogen dioxide, silicon oxynitride or a stack thereof. The thin film transistor T include a gate GE, a gate insulating layer GI, a source SE, a drain DE, and an active layer CL. The active layer CL is arranged on the buffer layer BL and corresponds to the light shielding layer LS. The gate insulating layer GI is arranged on the active layer CL, and the gate GE is arranged on the gate insulating layer GI. The interlayer insulating layer ILD covers the active layer CL and the buffer layer BL. Material of the interlayer insulating layer ILD can be selected from silica, nitrogen dioxide, silicon oxynitride or a stack thereof. The source DE and drain SE are arranged on the interlayer insulating layer ILD and connected to two ends of the active layer CL respectively. The embodiment takes a top gate thin film transistor as an example, but the thin film transistor of the present disclosure can also be a bottom gate thin film transistor or a double gate thin film transistor.

The first lead wire 20 is arranged in a same layer as the source SE and drain DE and formed of same material. Namely, the first lead wire 20 can be manufactured under a same mask with same material as the source and the drain DE. Specifically, the first lead wire 20 is arranged on the interlayer insulating layer ILD. The display panel 100 may include a plurality of first lead wires 20. The first lead wire 20 extends along a direction from the display area DA to the bezel area BA. One end of the first lead wire 20 is connected to a fanout line FL. The fanout line FL also is located in the bezel area BA and connected to a data line (not shown) in the display area DA. Another end of the first lead wire 20 is connected to the first cutting portion 40. Material of the first lead wire 20 may be a material with good conductivity, such as copper or aluminum. It can be understood that the first lead wire 20 can also be arranged in the same layer as other layers. For example, the first lead wire 20 can be arranged in the same layer as the gate GE. Alternatively, the first lead wire 20 may be arranged in the same layer as the source SE and drain DE, but the material is different.

The passivation layer PV covers the first lead wire 20, the source SE, the drain DE, and the interlayer insulating layer ILD. Material of the passivation layer PV may be selected from silica, nitrogen dioxide, silicon oxynitride or a stack thereof.

The first bonding pad 30 is used to bond the driver chip. The first bonding pad 30 is arranged on the passivation layer PV. Moreover, an orthographic projection of the first bonding pad 30 projected on a plane where the first lead wire 20 is located overlaps the first lead wire 20. Each first bonding pad 30 is connected with one first lead wire 20. Specifically, the passivation layer PV may be provided with a first via VIA1, the first via VIA1 exposes the first lead wire 20, and the first bonding pad 30 extends into the first via VIA1 and is connected with the first lead wire 20. As the first bonding pad 30 used for bonding the driver chip, its material can be material with strong corrosion resistance. For example, it can be selected from at least one of molybdenum, titanium, nickel and chromium.

The first cutting portion 40 is arranged on the passivation layer PV. The passivation layer PV is further provided with a second via VIA2, and the first cutting portion 40 extends into the second via VIA2 and is connected with the first lead wire 20. Because the first cutting portion 40 is formed after cutting through a board, its end surface is exposed to the outside environment. In order to prevent the end surface of the first cutting portion 40 from being corroded, a corrosion resistance of the first cutting portion 40 is greater than a corrosion resistance of the first lead wire 20. Therefore, in the present disclosure, material of the first cutting portion 40 is same as material of the first bonding pad 30, which is at least one of molybdenum, titanium, nickel and chromium. In addition, a thickness of the first cutting portion 40 is less than a thickness of the first lead wire 20. For example, the thickness of the first lead wire 20 is 8000 angstroms and the thickness of the first cutting portion 40 is 1000 angstroms. As described above, the first cutting portion 40 and the first bonding pad 30 can be manufactured under the same mask with the same material, and the exposed first cutting portion 40 can be prevented from being corroded without increasing the number of processes.

The planarization layer PLN covers the passivation layer PV, the first bonding pad 30 and the first cutting portion 40. Furthermore, referring to FIG. 3, the planarization layer PLN only covers a part of the first cutting portion 40 connected with the first lead wire 20 and exposes a portion of the first cutting portion 40 away from the first lead wire 20. Thus, it is convenient to cut and form the first cutting portion 40.

In the present embodiment, the first cutting portion 40 is formed by using the metal layer forming the first bonding pad 30, a corrosion resistance of the material of the first bonding pad 30 is greater than a corrosion resistance of the material forming the first lead wire 20, and a thickness of the material of the first bonding pad 30 is less than a thickness of the first lead wire 20, which can reduce the electrochemical corrosion of the exposed first cutting portion 40 without adding a new process.

It should be noted that this embodiment is illustrated the lower bezel area as an example in the following, but the same structure can also be configured for the lead wire and cutting portion in the upper bezel area, left bezel area or right bezel area.

In other embodiments of the present disclosure, the display panel 100 may also include a second lead wire and a second cutting portion. The second lead wire and the first lead wire are arranged in a same layer and have same material, the second lead wire is spaced apart from the first lead wire, the second cutting portion is located on a side of the second lead wire away from the display area and connected with the second lead wire, and the second cutting portion and the first cutting portion are located in different layers. The following will be described in conjunction with FIGS. 5 to 8.

Figure 5:
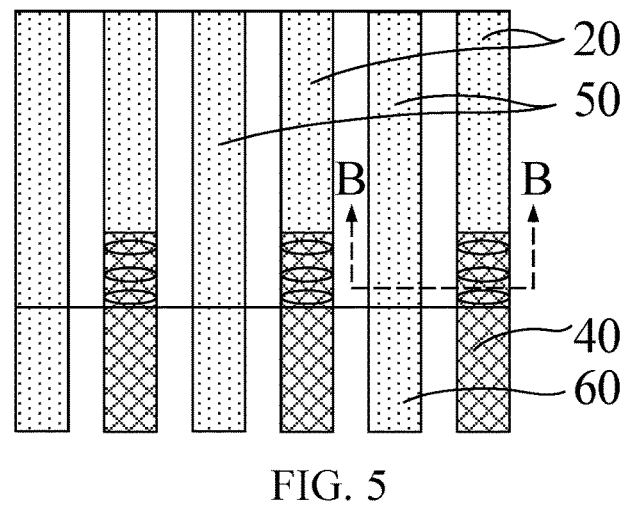
FIG. 5 is an enlarged schematic view of a portion O1 of a second embodiment of the display panel of the present disclosure.
Figure 6:
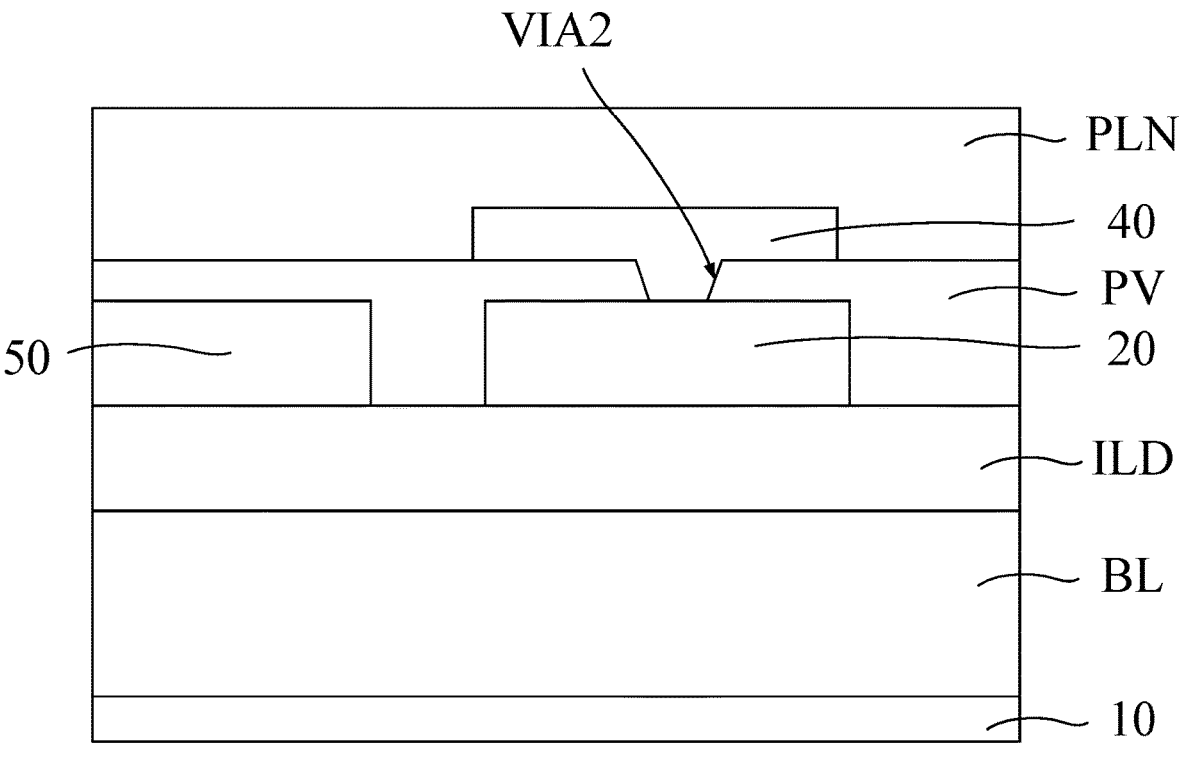
FIG. 6 is a schematic sectional view of FIG. 5 along line B-B.

Referring to FIG. 5 and FIG. 6, the difference between a second embodiment of the display panel 100 of the present disclosure and the first embodiment of the display panel 100 is that: in the first embodiment, the structures of the cutting portions connected with the lead wires are same, while the second embodiment of the display panel 100 includes two different cutting portions. Specifically, the display panel 100 further includes a second lead wire 50. The second lead wire 50 is arranged in a same layer as the first lead wire 20 and has same material, and the second lead wire 50 is spaced apart from the first lead wire 20. It can be understood that the second lead wire 50 and the first lead wire 20 can only be arrange in same layer, but material is different. Alternatively, the display panel 100 includes a plurality of first lead wires 20 and a plurality of second lead wires 50. The plurality of first lead wires 20 and the plurality of second lead wires 50 extend along a direction from the display area DA to the bezel area BA. The plurality of first lead wires 20 and the plurality of second lead wires 50 are arranged alternately at intervals. Namely, the plurality of second lead wires 50 and the plurality of first lead wires 20 may be arranged in a sequence of one second lead wire 50 and one first lead wire 20. One end of the second lead wire 50 away from the display area DA has a second cutting portion 60. Namely, the second cutting portion 60 includes an end of the second lead wire 50 away from the display area DA. In addition, it can be understood that the display panel 100 of the second embodiment further includes a second bonding pad (not shown). The second bonding pad is connected with the second lead wire 50. The second bonding pad is arranged in a same layer as the first bonding pad 30, the second bonding pad is spaced apart from the first bonding pad 30, and formed of same material as the first bonding pad 30.

In the present embodiment, the first cutting portion 40 is located in a same layer as the first bonding pad 30, and the second cutting portion 60 is located in a same layer as the second lead wire 50 and the first lead wire 20. Namely, the first cutting portion 40 and the second cutting portion 60 are made of two different metal layers. Compared with the case that all cutting portions are located in same layer, the first cutting portion 40 and the second cutting portion 60 are made of two different metal layers, which can prevent a short circuit between the first cutting portion 40 and the second cutting portion 60.

Figure 7:
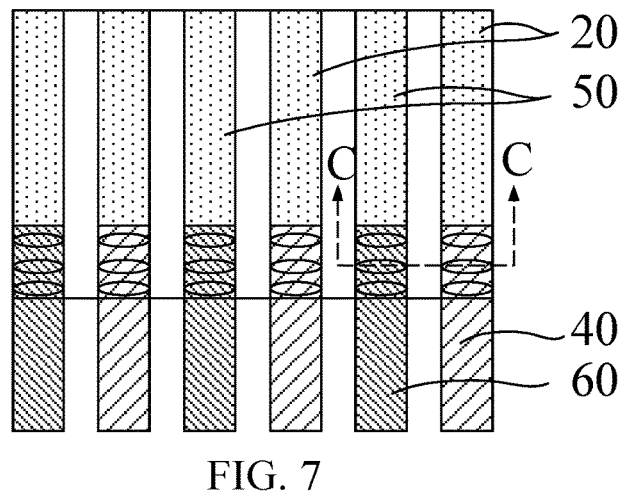
FIG. 7 is an enlarged schematic view of a portion O1 of a third embodiment of the display panel of the present disclosure.
Figure 8:
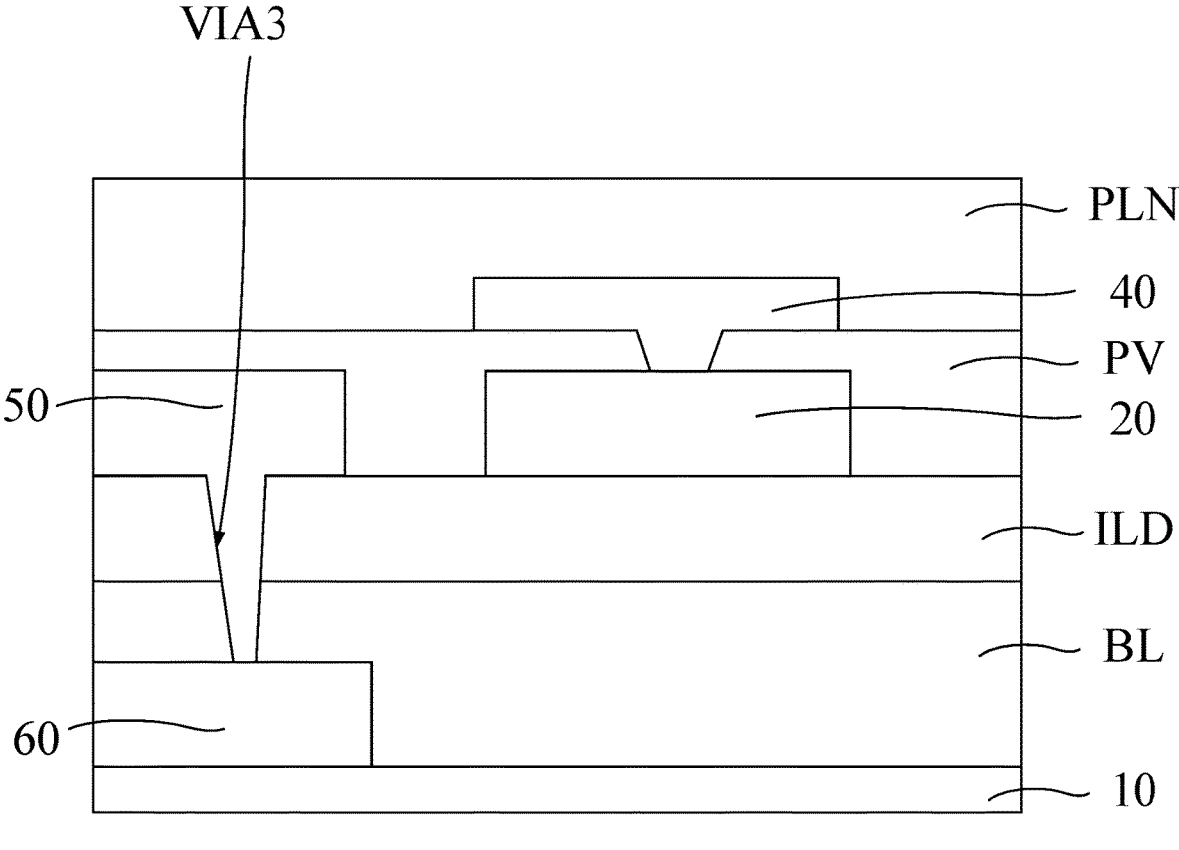
FIG. 8 is a schematic sectional view of FIG. 7 along line C-C.
Figure 10:
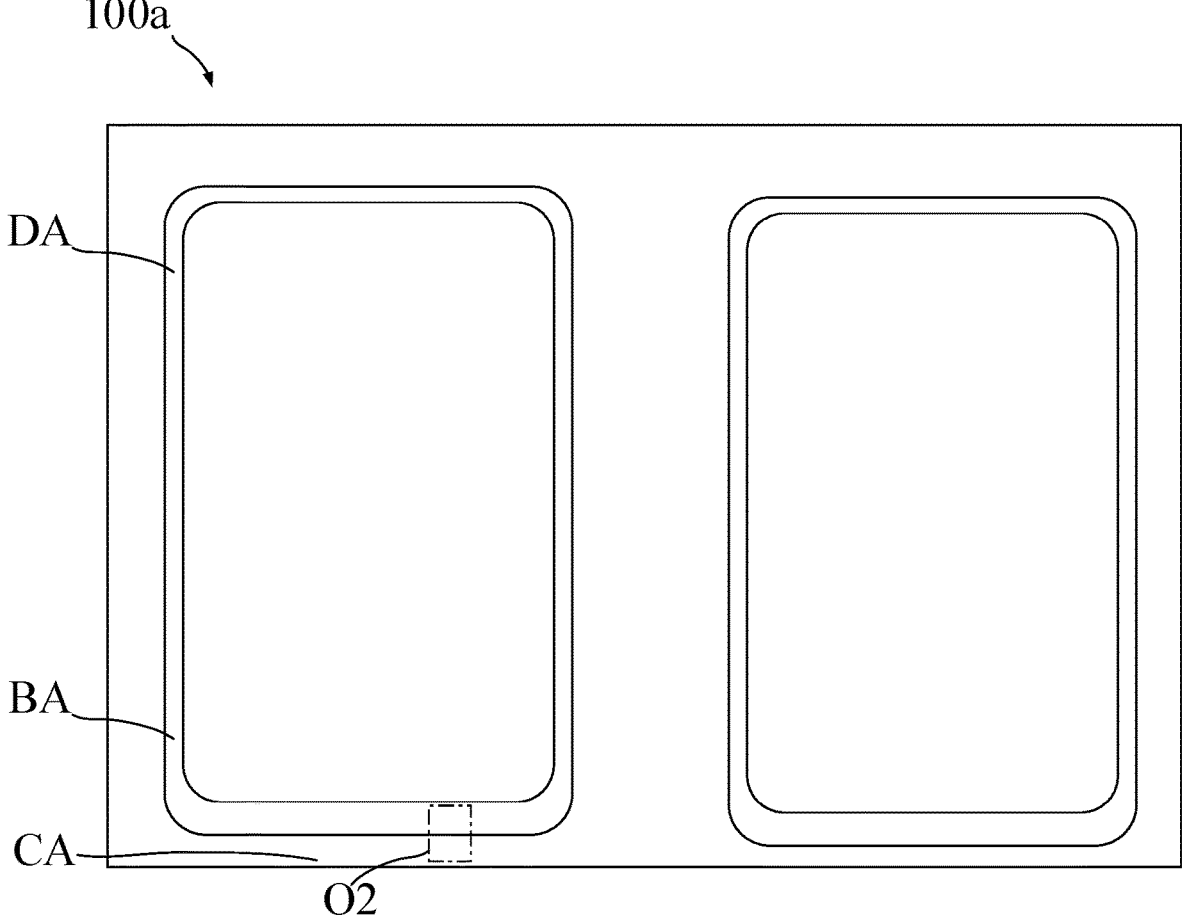
FIG. 10 is a schematic top view of a first embodiment of a intermediate substrate of the present disclosure.
Figure 11:
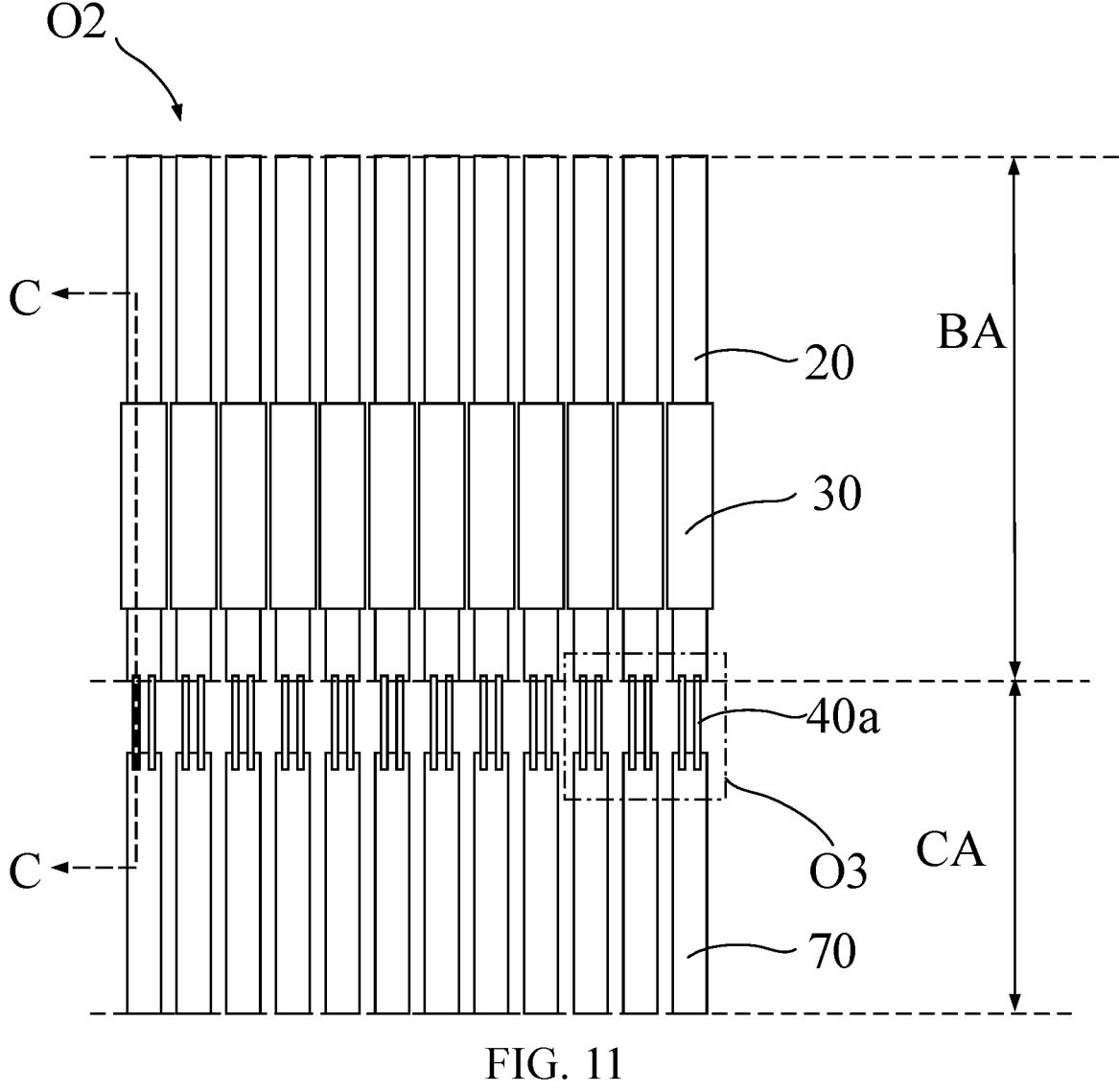
FIG. 11 is an enlarged schematic view of a portion O2 of the intermediate substrate of the present disclosure.
Figure 12:
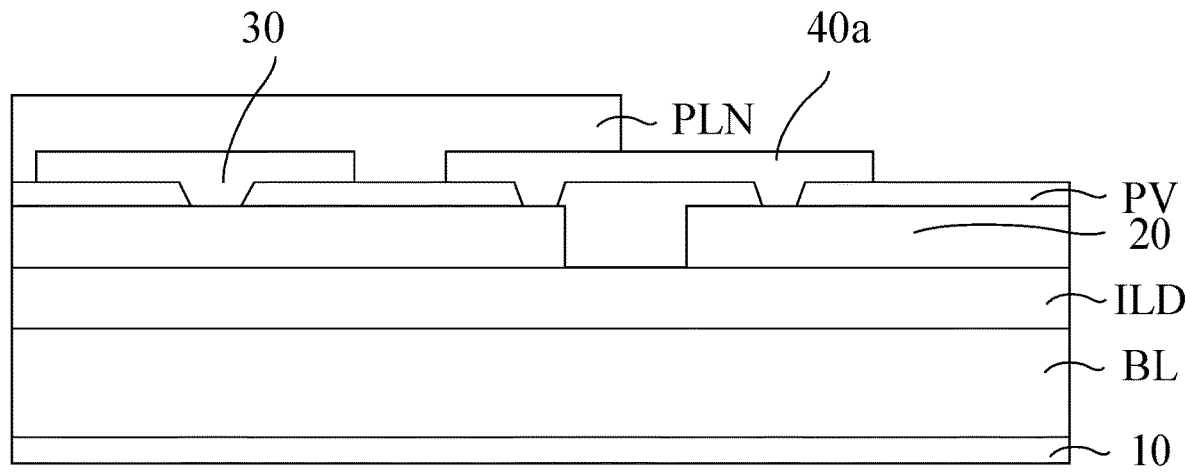
FIG. 12 is a schematic sectional view of FIG. 11 along line D-D.

Referring to FIGS. 7 and 8, the difference between a third embodiment of the display panel 100 of the present disclosure and the first embodiment of the display panel 100 is that: in the first embodiment, the structures of the cutting portions connected with the lead wires are same, while the third embodiment of the display panel 100 includes two different cutting portions. Specifically, the third embodiment of the display panel 100 of the present disclosure further includes a second lead wire 50 and a second cutting portion 60, the second lead wire 50 is arranged in a same layer and formed of same material as the first lead wire 20, and the second lead wire 50 is spaced apart from the first lead wire 20. It can be understood that the second lead wire 50 and the first lead wire 20 can only be arrange in same layer, but material is different.

Alternatively, the display panel 100 includes a plurality of first lead wires 20 and a plurality of second lead wires 50. The plurality of first lead wires 20 and the plurality of second lead wires 50 extend along a direction from the display area DA to the bezel area BA. The plurality of first lead wires 20 and the plurality of second lead wires 50 are arranged alternately at intervals. Namely, the plurality of second lead wires 50 and the plurality of first lead wires 20 may be arranged in a sequence of one second lead wire 50 and one first lead wire 20. The second cutting portion 60 is located between the substrate 10 and the second lead wire 50, and the second cutting portion 60 is located on a side of the second lead wire 50 away from the display area DA and connected with the second lead wire 50. Specifically, the second cutting portion 60 and the second lead wire 50 are connected through a third via VIA3 penetrating through the interlayer insulating layer ILD and the buffer layer BL. In addition, it can be understood that the display panel 100 of the second embodiment further includes a second bonding pad (not shown). The second bonding pad is connected with the second lead wire 50. The second bonding pad is arranged in a same layer as the first bonding pad 30, the second bonding pad is spaced apart from the first bonding pad 30, and formed of same material as the first bonding pad 30.

Same as the first embodiment, the buffer layer BL is arranged on the substrate 10. A pixel driving circuit (not shown) is provided in the display area DA. The pixel driving circuit includes thin film transistors T and a light shielding layer LS. The light shielding layer LS is disposed on the substrate 10. Material of the light shielding layer LS may be a metal or a metal oxide, such as molybdenum (Mo), titanium (Ti), molybdenum oxide, etc. The buffer layer BL covers the light shielding layer LS. Material of the buffer layer BL may be selected from silica, nitrogen dioxide, silicon oxynitride or a stack thereof. The thin film transistor T include a gate GE, a gate insulating layer GI, a source SE, a drain DE, and an active layer CL. The active layer CL is arranged on the buffer layer BL and corresponds to the light shielding layer LS. The gate insulating layer GI is arranged on the active layer CL, and the gate GE is arranged on the gate insulating layer GI. The interlayer insulating layer ILD covers the active layer CL and the buffer layer BL. Material of the interlayer insulating layer ILD can be selected from silica, nitrogen dioxide, silicon oxynitride or a stack thereof. The source DE and drain SE are arranged on the interlayer insulating layer ILD and connected to two ends of the active layer CL respectively. The second lead wire 50 is arranged in a same layer as the source SE and drain DE and formed of same material as the source SE and drain DE, and the second cutting portion 60 is arranged in a same layer as the light shielding layer LS and formed of same material as the light shielding layer LS.

In the present embodiment, the first cutting portion 40 is located in a same layer as the first bonding pad 30, and the second cutting portion 60 is located in a same layer as the light shielding layer LS. Namely, the first cutting portion 40 and the second cutting portion 60 are made of two different metal layers. Compared with the case that all cutting portions are located in same layer, the first cutting portion 40 and the second cutting portion 60 are located in different metal layers, which can prevent a short circuit between the first cutting portion 40 and the second cutting portion 60.

Figure 9:
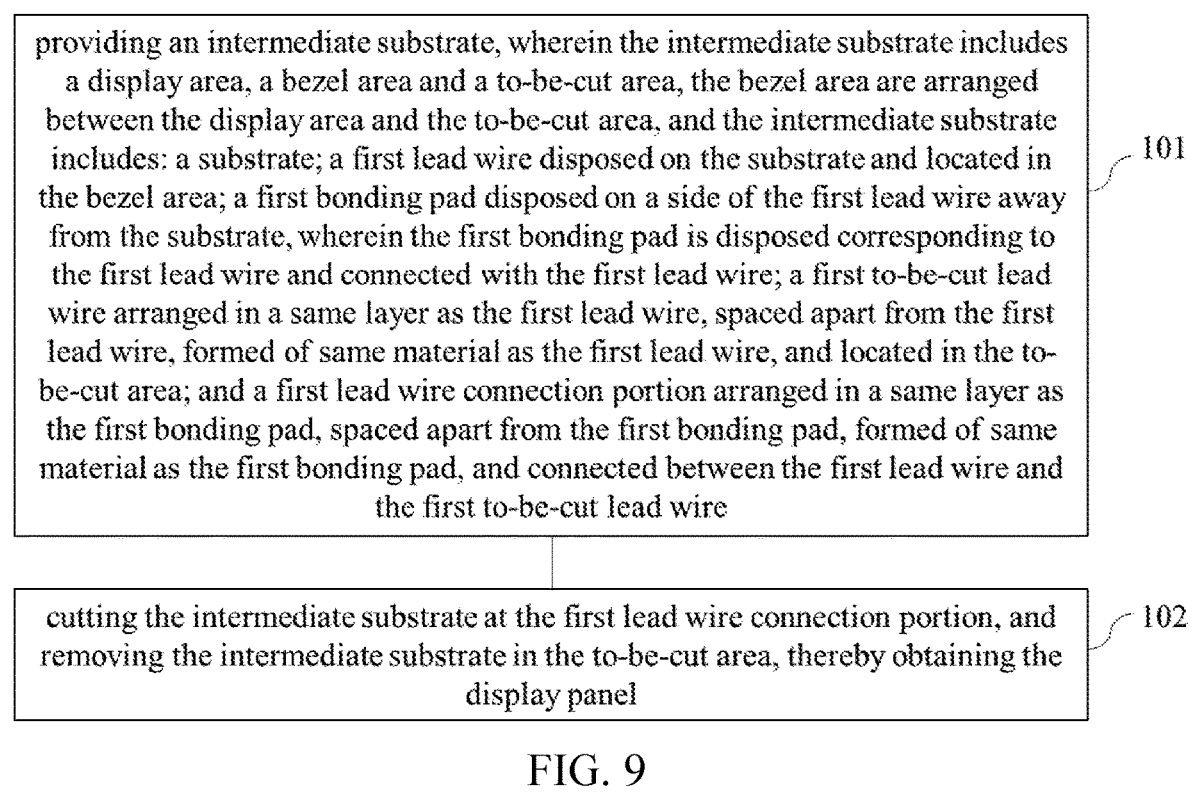

Referring to FIG. 9, the present disclosure further provides a manufacturing method of a display panel, including steps of:

Step 101: referring to FIGS. 10 to 13, providing an intermediate substrate 10. The intermediate substrate 10 includes a display area DA, a bezel area BA and a to-be-cut area CA. The bezel area BA is arranged between the display area DA and the to-be-cut area CA. The intermediate substrate 10 includes:

a substrate 10;

a first lead wire 20 disposed on the substrate 10, and the first lead wire 20 located in the bezel area BA;

a first bonding pad 30 arranged on a side of the first lead wire 20 away from the substrate 10, and the first bonding pad 30 arranged corresponding to the first lead wire 20 and connected with the first lead wire 20;

a first to-be-cut lead wire 70 arranged in a same layer as the first lead wire 20, the first to-be-cut lead wire 70 spaced apart from the first lead wire 20, and formed of same material as the first lead wire 20, and the first to-be-cut lead wire 70 is located in the to-be-cut area CA; and a first lead wire connection portion 40a arranged in a same layer as the first bonding pad 30, the first lead wire connection portion 40a spaced apart from the first bonding pad 30 and formed of same material as the first bonding pad 30, and the first lead wire connection portion 40a connected between the first lead wire 20 and the first to-be-cut lead wire 70.

Specifically, the intermediate substrate 10 may be a board. The display area DA is provided with a pixel driving circuit, OLED light emitting components, a thin film encapsulation layer and other structures. The bezel area BA is configuration adjacent to the display area DA. The bezel area BA is provided with lead wires, etc., and the bezel area BA is bonded with a driver chip. Optionally, the bezel area BA can be configured around the display area DA. The bezel area BA may include an upper bezel area, a lower bezel area, a left bezel area or a right bezel area. Hereinafter, a structure of the lower bezel area is described as an example. The term "to-be-cut area CA" or known as "feeding area" refers to a portion that is removed by cutting before bonding the driver chip. The to-be-cut area CA is provided with lines and pads for array tests or cell tests, in which the first to-be-cut lead wire 70 is included. The to-be-cut area CA belongs to an invalid area in the display panel 100, so it will be removed by cutting. For the configurations of the substrate 10, the first lead wire 20 and the first bonding pad 30, refer to the first embodiment, and their descriptions are omitted here. The first lead wire connection portion 40a is connected between the first lead wire 20 and the first to-be-cut lead wire 70, so that the first to-be-cut lead wire 70 can be used for array test or cell test.

In other embodiments of the present disclosure, an intermediate panel may further include a second lead wire, a second to-be-cut lead wire and a second lead wire connection portion. The second lead wire is arranged in a same layer as the first lead wire and has the same material as the first lead wire, and the second lead wire is spaced apart from the first lead wire. The second to-be-cut lead wire is located in the to-be-cut area CA. The second to-be-cut lead wire is arranged in a same layer as the second lead wire, the second to-be-cut lead wire is spaced apart from the second lead wire and formed of same material as the second lead wire. The second lead wire connection portion is located on a side of the second lead wire away from the display area and connected with the second lead wire, and the second lead wire connection portion and the first lead wire connection portion are located in different layers.

Figure 14:
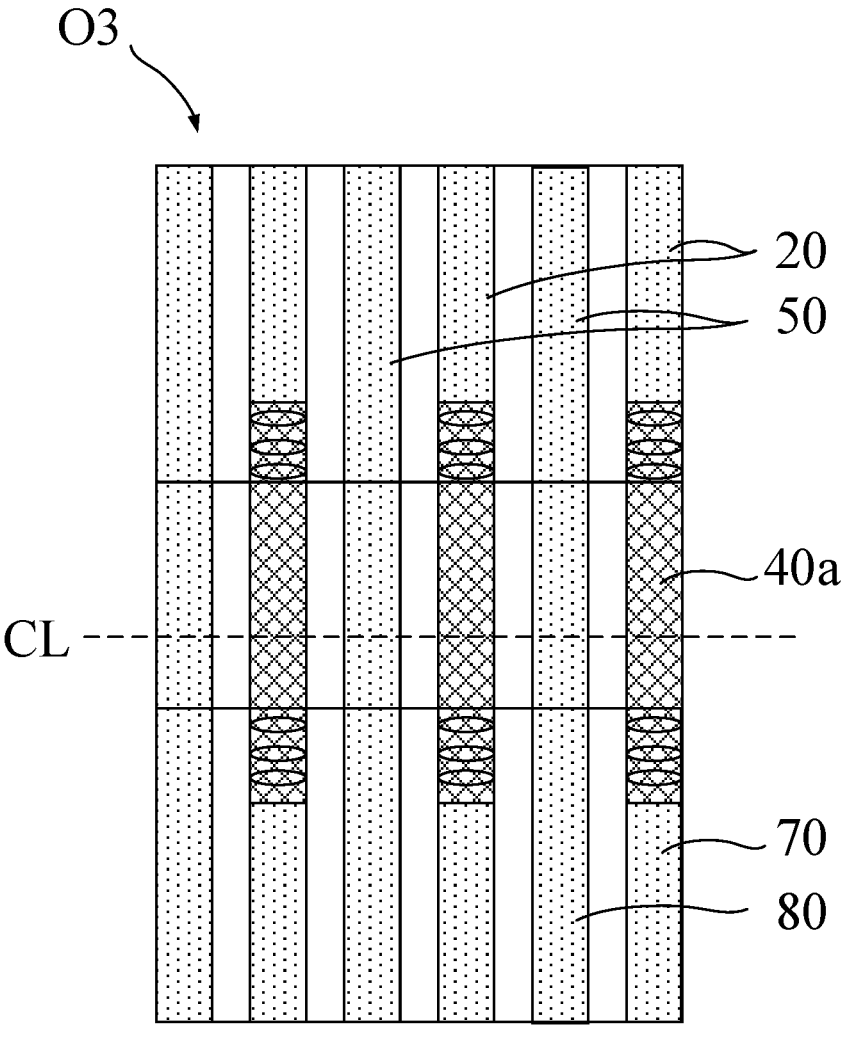
FIG. 14 is a schematic top view of a portion O3 of a second embodiment of the intermediate substrate of the present disclosure.

Specifically, referring to FIG. 14, the second embodiment of the intermediate substrate 10 of the present disclosure further includes a second lead wire 50 and a second to-be-cut lead wire 80. The second lead wire 50 is arranged in a same layer as the first lead wire 20 and has same material, and the second lead wire 50 is spaced apart from the first lead wire 20. It can be understood that the second lead wire 50 and the first lead wire 20 can only be arrange in same layer, but material is different. The second lead wire 50 is arranged in a same layer as the second to-be-cut lead wire 80 and has same material as the second to-be-cut lead wire 80. It can be understood that the second lead wire 50 and the second to-be-cut lead wire 80 can further be only arrange in a same layer, but the material is different. Alternatively, the display panel 100 includes a plurality of first lead wires 20 and a plurality of second lead wires 50. The plurality of first lead wires 20 and the plurality of second lead wires 50 extend along a direction from the display area DA to the bezel area BA. The plurality of first lead wires 20 and the plurality of second lead wires 50 are arranged alternately at intervals. Namely, the plurality of second lead wires 50 and the plurality of first lead wires 20 may be arranged in a sequence of one second lead wire 50 and one first lead wire 20. One end of the second lead wire 50 away from the display area DA has a second lead wire connection portion 60a. Namely, the second lead wire connection portion 60a includes an end of the second lead wire 50 away from the display area DA. In addition, it can be understood that the display panel 100 of the second embodiment further includes a second bonding pad (not shown). The second bonding pad is connected with the second lead wire 50. The second bonding pad is arranged in a same layer as the first bonding pad 30, the second bonding pad is spaced apart from the first bonding pad 30, and formed of same material as the first bonding pad 30.

Figure 15:
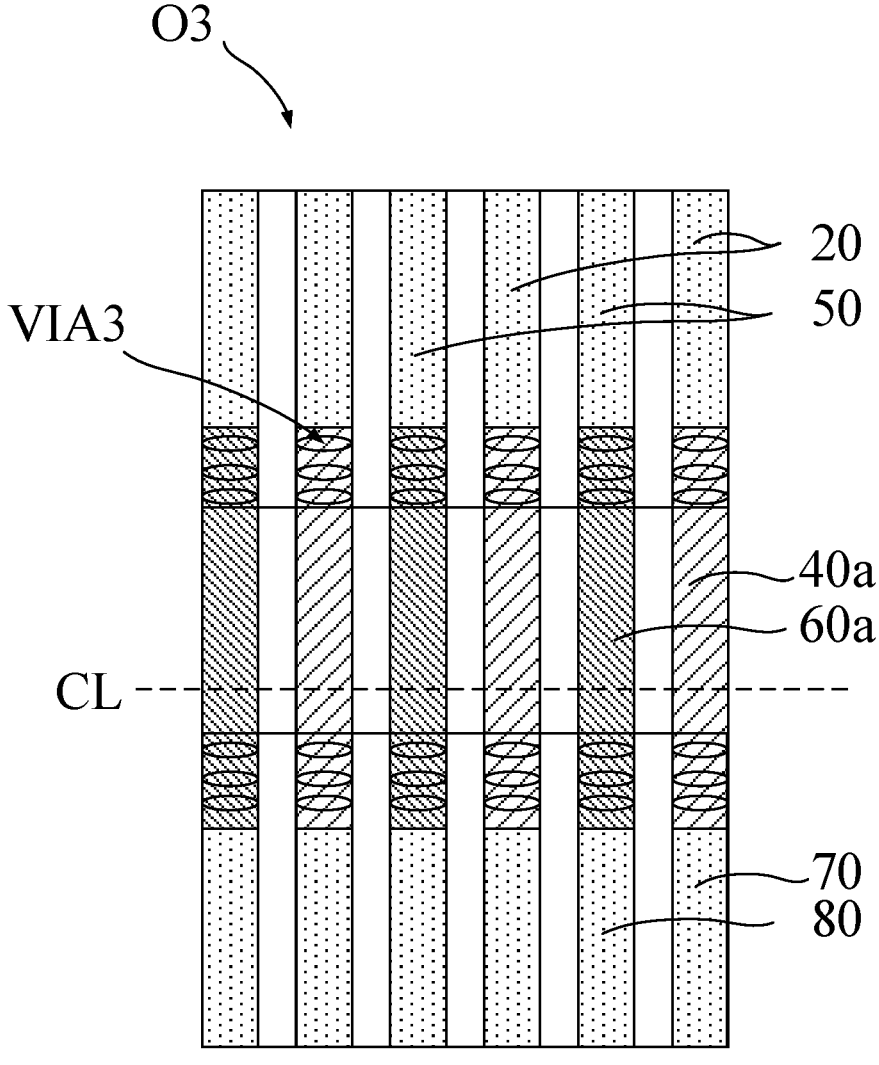
FIG. 15 is a schematic top view of a O3 portion of a third embodiment of the intermediate substrate of the present disclosure.

Referring to FIG. 15, a third embodiment of the intermediate substrate 10 of the present disclosure further includes a second lead wire 50, a second to-be-cut lead wire 80, and a second lead wire connection portion 60a. The second lead wire 50 is arranged in a same layer as the first lead wire 20 and has same material, and the second lead wire 50 is spaced apart from the first lead wire 20. It can be understood that the second lead wire 50 and the first lead wire 20 can only be arrange in same layer, but material is different. The second lead wire 50 is arranged in a same layer as the second to-be-cut lead wire 80 and has same material as the second to-be-cut lead wire 80. Alternatively, the display panel 100 includes a plurality of first lead wires 20 and a plurality of second lead wires 50. The plurality of first lead wires 20 and the plurality of second lead wires 50 extend along a direction from the display area DA to the bezel area BA. The plurality of first lead wires 20 and the plurality of second lead wires 50 are arranged alternately at intervals. Namely, the plurality of second lead wires 50 and the plurality of first lead wires 20 may be arranged in a sequence of one second lead wire 50 and one first lead wire 20. The second lead wire connection portion 60a is located between the substrate 10 and the second lead wire 50, the second cutting portion 60, and the second lead wire connection portion 60a are located on a side of the second lead wire 50 away from the display area DA and connected with the second lead wire 50. The second lead wire 50 is arranged in a same layer as the source SE and drain DE and formed of same material as the source SE and drain DE, and the second lead wire connection portion 60a is arranged in the same layer as the light shielding layer LS and formed of same material as the light shielding layer LS.

In addition, it can be understood that the display panel 100 of the second embodiment further includes a second bonding pad (not shown). The second bonding pad is connected with the second lead wire 50. The second bonding pad is arranged in a same layer as the first bonding pad 30, the second bonding pad is spaced apart from the first bonding pad 30, and formed of same material as the first bonding pad 30.

Step 102: cutting the intermediate substrate 10 at the first lead wire connection portion 40a, and removing the intermediate substrate 10 in the to-be-cut area CA, thereby obtaining the display panel 100.

Figure 13:
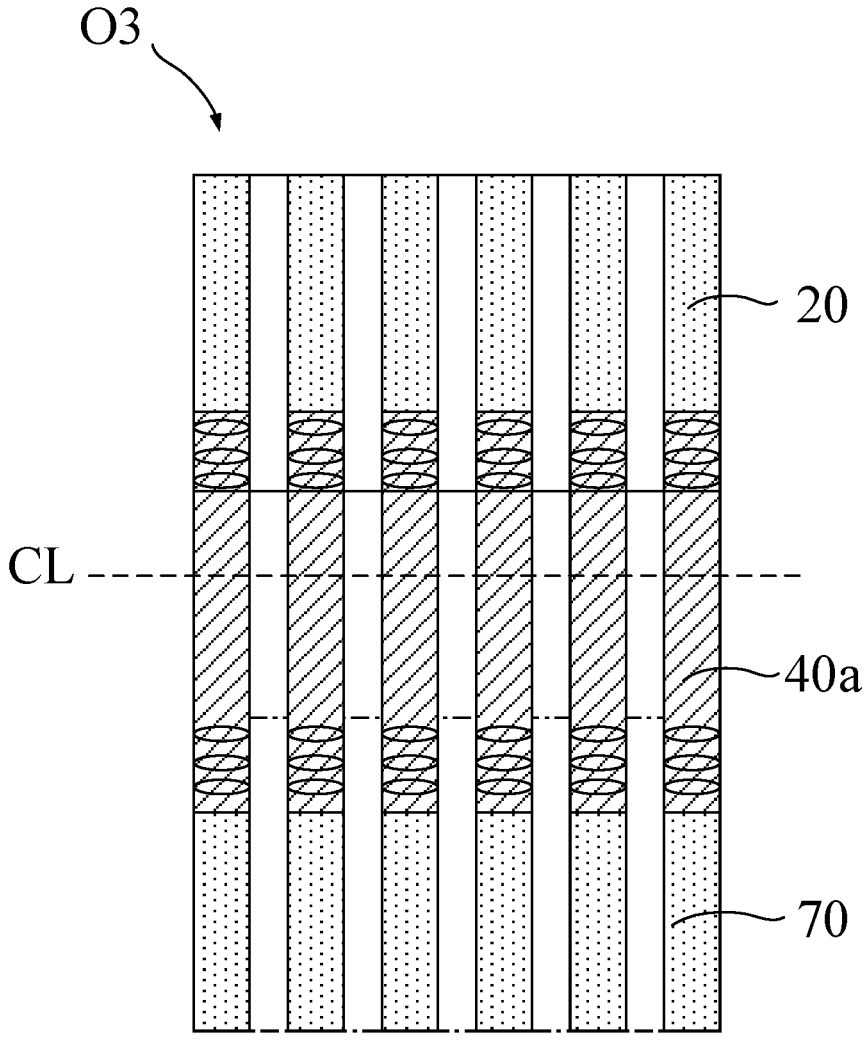
FIG. 13 is an enlarged schematic view of a portion O3 of FIG. 11.

Referring to FIG. 13, in the step 102, cutting the intermediate substrate 10 at the first lead wire connection portion 40a along the cutting line CL. The first lead wire connection portion 40a connected with the first lead wire 20 forms the first cutting portion 40, thereby obtaining the display panel 100 of the present disclosure. In the display panel 100 of the present disclosure, the first lead wire connection portion 40a is arranged in a same layer as the first bonding pad 30, the first lead wire connection portion 40a is spaced apart from the first bonding pad 30 and formed of same material as the first bonding pad 30. The first lead wire connection portion 40a is formed by using the metal layer forming the first bonding pad 30, and then the first cutting portion 40 is formed. Because a corrosion resistance of the material of the first bonding pad 30 is greater than a corrosion resistance of the material forming the first lead wire 20, and a thickness of material of the first bonding pad 30 is less than a thickness of the first lead wire 20, which can reduce the electrochemical corrosion of the exposed first cutting portion 40 without adding a new process.

Referring to FIGS. 14 and 15, in the step 102, by cutting the intermediate substrate 10 at the first lead wire connection portion 40a and the second lead wire connection portion 60a, the first lead connection portion 40a connected with the first lead 20 forms the first cutting portion 40, and the second lead connection portion 60a connected with the second lead wire 50 forms the second cutting portion 60, thereby obtaining the display panel 100 of the present disclosure. Because the formed first cutting portion 40 and the second cutting portion 60 are located in different metal layers, a short circuit between the first cutting portion 40 and the second cutting portion 60 can be prevented.

The above contents provide a detailed introduction to the embodiments of the application, specific examples are used in this article to describe the principles and implementations of the application, and the description of the above embodiments is only used to help understand the application. Meanwhile, those skilled in the art may change or modify the specific implements and application scopes according to the concept of the application. In view of the above, the contents of the specification should not be understood as limitations of the application.

What is claimed is:

1. A display panel comprising a display area and a bezel area arranged adjacent to the display area, wherein the display panel comprises:

a substrate;

a first lead wire disposed on the substrate and located in the bezel area;

a passivation layer covering the first lead wire;

a first bonding pad disposed on a side of the first lead wire away from the substrate and arranged on the passivation layer, wherein the first bonding pad is disposed corresponding to the first lead wire and connected with the first lead wire, and an orthographic projection of the first bonding pad projected on a plane where the first lead wire is located overlaps the first lead wire; and a first cutting portion arranged on the passivation layer and in a same layer as the first bonding pad, spaced apart from the first bonding pad and formed of same material as the first bonding pad, wherein the first cutting portion is located on a side of the first lead wire away from the display area and connected with the first lead wire.

2. The display panel according to claim 1, further comprising a second lead wire and a second cutting portion, wherein the second lead wire is arranged in a same layer as the first lead wire, the second lead wires is spaced apart from the first lead wires, the second cutting portion is located on a side of the second lead wire away from the display area and connected with the second lead wire, and the second cutting portion and the first cutting portion are located in different layers.

3. The display panel according to claim 2, wherein the second cutting portion comprises an end of the second lead wire away from the display area; or the second cutting portion is located between the substrate and the second lead wire.

4. The display panel according to claim 2, comprising a plurality of the first lead wires and a plurality of the second lead wires, and the plurality of first lead wires and the plurality of second lead wires are arranged alternately at intervals.

5. The display panel according to claim 1, comprising a thin film transistor, wherein the thin film transistor comprises a source and a drain, and the source and the drain are arranged in a same layer as the first lead wire.

6. The display panel according to claim 3, comprising a thin film transistor, wherein the thin film transistor comprises a source, a drain and an active layer, the source and the drain are arranged in the same layer as the first lead wire, the active layer is arranged between the source and the substrate, the display panel further comprises a light shielding layer, the light shielding layer is arranged between the active layer and the substrate, and the second cutting portion is arranged in a same layer as the light shielding layer.

7. The display panel according to claim 4, comprising a thin film transistor, wherein the thin film transistor comprises a source, a drain and an active layer, the source and the drain are arranged in the same layer as the first lead wire, the active layer is arranged between the source and the substrate, the display panel further comprises a light shielding layer, the light shielding layer is arranged between the active layer and the substrate, and the second cutting portion is arranged in a same layer as the light shielding layer.

8. The display panel according to claim 1, wherein a corrosion resistance of the first cutting portion is greater than a corrosion resistance of the first lead wire.

9. The display panel according to claim 1, wherein material of the first lead wire is copper or aluminum, and material of the first cutting portion is at least one of molybdenum, titanium, nickel and chromium.

10. The display panel according to claim 1, further comprising a planarization layer arranged on a side of the bonding pad away from the first lead wire, wherein the planarization layer covers a part of the first cutting portion connected with the first lead wire and exposes a part of the first cutting portion away from the first lead wire.

11. The display panel according to claim 1, comprising a data line and a fanout line, wherein the data line is located in the display area, the fanout line is located in the bezel area, and the fanout line is connected between the data line and the first lead wire.

12. A manufacturing method of a display panel, comprising steps of:
  providing an intermediate substrate, wherein the intermediate substrate comprises a display area, a bezel area and a to-be-cut area, the bezel area are arranged between the display area and the to-be-cut area, and the intermediate substrate comprises:
    a substrate;
    a first lead wire disposed on the substrate, and located in the bezel area;
    a passivation layer covering the first lead wire;
    a first bonding pad disposed on a side of the first lead wire away from the substrate and arranged on the passivation layer, wherein the first bonding pad is disposed corresponding to the first lead wire and connected with the first lead wire, and an orthographic projection of the first bonding pad projected on a plane where the first lead wire is located overlaps the first lead wire;
    a first to-be-cut lead wire arranged in a same layer as the first lead wire, spaced apart from the first lead wire, formed of same material as the first lead wire, and located in the to-be-cut area; and
    a first lead wire connection portion arranged on the passivation layer and in a same layer as the first bonding pad, spaced apart from the first bonding pad, formed of same material as the first bonding pad, and connected between the first lead wire and the first to-be-cut lead wire; and
  cutting the intermediate substrate at the first lead wire connection portion to form a first cutting portion, and removing the intermediate substrate in the to-be-cut area, thereby obtaining the display panel.

13. The manufacturing method of the display panel according to claim 12, wherein the intermediate substrate further comprises a second lead wire, a second to-be-cut lead wire and a second lead wire connection portion, wherein the second lead wire is arranged in the same layer as the first lead wire, the second lead wire is spaced apart from the first lead wire, the second to-be-cut lead wire is located in the to-be-cut area, the second to-be-cut lead wire is spaced apart from the second lead wire, the second lead wire connection portion is located on a side of the second lead wire away from the display area and connected with the second lead wire, and the second lead wire connection portion and the first lead wire connection portion are located in different layers, and
  the manufacturing method of the display panel further comprises cutting the intermediate substrate at the second lead wire connection portion, and removing the intermediate substrate in the to-be-cut area, thereby obtaining the display panel.

14. The manufacturing method of the display panel according to claim 13, wherein the second lead wire connection portion comprises an end of the second lead wire away from the display area; or
  the second lead wire connection portion is located between the substrate and the second lead wire.

15. The manufacturing method of the display panel according to claim 13, wherein the intermediate substrate comprises a plurality of the first lead wires and a plurality of the second lead wires, and the plurality of first lead wires and the plurality of second lead wires are arranged alternately at intervals.

16. The manufacturing method of the display panel according to claim 12, wherein the intermediate substrate comprises a thin film transistor, and the thin film transistor comprises a source and a drain, and the source and the drain arranged in a same layer as the first lead wire.

17. The manufacturing method of the display panel according to claim 14, wherein the intermediate substrate comprises a thin film transistor, the thin film transistor comprising a source, a drain and an active layer, the source and the drain arranged in the same layer as the first lead wire, the active layer arranged between the source and the substrate, the intermediate substrate further comprises a light shielding layer, the light shielding layer arranged between the active layer and the substrate, and the second lead wire connection portion arranged in a same layer as the light shielding layer.

18. The manufacturing method of the display panel according to claim 15, wherein the intermediate substrate comprises a thin film transistor, the thin film transistor comprising a source, a drain and an active layer, the source and the drain arranged in the same layer as the first lead wire, the active layer arranged between the source and the substrate, the intermediate substrate further comprises a light shielding layer, the light shielding layer arranged between the active layer and the substrate, and the second lead wire connection portion arranged in the same layer as the light shielding layer.

19. The manufacturing method of the display panel according to claim 12, wherein a corrosion resistance of the first lead wire connection portion is greater than a corrosion resistance of the first lead wire.

20. The display panel according to claim 1, wherein a thickness of the first cutting portion is less than a thickness of the first lead wire.

* * * * *